(12) United States Patent
Guo et al.

(10) Patent No.: US 9,164,836 B2
(45) Date of Patent: Oct. 20, 2015

(54) CYCLING ENDURANCE EXTENDING FOR MEMORY CELLS OF A NON-VOLATILE MEMORY ARRAY

(75) Inventors: Xin Guo, San Jose, CA (US); Kiran Pangal, Fremont, CA (US); Yogesh B. Wakchaure, Folsom, CA (US); Paul D. Ruby, Folsom, CA (US); Ravi J. Kumar, Redwood City, CA (US)

(73) Assignee: INTEL CORPORATION, Santa Clara, CA (US)

( * ) Notice: Subject to any disclaimer, the term of this patent is extended or adjusted under 35 U.S.C. 154(b) by 178 days.

(21) Appl. No.: 13/976,007

(22) PCT Filed: Dec. 28, 2011

(86) PCT No.: PCT/US2011/067558
§ 371 (c)(1),
(2), (4) Date: Jun. 25, 2013

(87) PCT Pub. No.: WO2013/100958
PCT Pub. Date: Jul. 4, 2013

(65) Prior Publication Data
US 2014/0047302 A1 Feb. 13, 2014

(51) Int. Cl.
*G06F 11/00* (2006.01)
*G06F 11/10* (2006.01)
*G11C 11/56* (2006.01)
*G11C 16/06* (2006.01)
*G11C 16/26* (2006.01)
*G11C 16/34* (2006.01)

(52) U.S. Cl.
CPC ........ *G06F 11/1068* (2013.01); *G11C 11/5642* (2013.01); *G11C 16/06* (2013.01); *G11C 16/26* (2013.01); *G11C 16/3409* (2013.01)

(58) Field of Classification Search
CPC .... G11C 16/06; G11C 16/26; G11C 16/3409; G11C 11/5642; G06F 11/1068
See application file for complete search history.

(56) References Cited

U.S. PATENT DOCUMENTS

| | | | |
|---|---|---|---|
| 2008/0266970 A1 | 10/2008 | Lee et al. | |
| 2009/0034339 A1 | 2/2009 | Eguchi et al. | |
| 2009/0091990 A1* | 4/2009 | Park et al. | 365/189.011 |
| 2009/0122608 A1 | 5/2009 | Aritome | |
| 2010/0306580 A1* | 12/2010 | McKean et al. | 714/8 |
| 2011/0209032 A1 | 8/2011 | Choi et al. | |

OTHER PUBLICATIONS

International Search Report and Written Opinion, Mailed Date: Sep. 19, 2012, Application No. PCT/US2011/067558, Filed Date: Dec. 28, 2011, pp. 11.

* cited by examiner

*Primary Examiner* — Sam Rizk
(74) *Attorney, Agent, or Firm* — Kacvinsky Daisak Bluni PLLC

(57) ABSTRACT

Examples are disclosed for cycling endurance extending for memory cells of a non-volatile memory array. The examples include implementing one or more endurance extending schemes based on program/erase cycle counts or a failure trigger. The one or more endurance extending schemes may include a gradual read window expansion, a gradual read window shift, an erase blank check algorithm, a dynamic soft-program or a dynamic pre-program.

27 Claims, 10 Drawing Sheets

TEV Read Window Expansion Table 400

| Target Cycle Count | TEV Adjust (mV) |
|---|---|
| 1 | 1000 |
| 1000 | 850 |
| 3000 | 640 |
| 5000 | 540 |
| 10000 | 410 |
| 20000 | 280 |
| 30000 | 200 |

Multi-Level Cell Programming Distributions 500

TEV/PV Read Window Expansion Table 600

| Target Cycle Count | TEV Adjust (mV) | PV3 Adjust (mV) |
|---|---|---|
| 1 | +1000 | -400 |
| 1000 | +850 | -350 |
| 3000 | +640 | -300 |
| 5000 | +540 | -250 |
| 10000 | +410 | -200 |
| 20000 | +280 | -150 |
| 30000 | +200 | -100 |

TEV/PV Read Window Shift Table 900

| Target Cycle Count | TEV Adjust (mV) | PV3 Adjust (mV) |
|---|---|---|
| 1 | +200 | -100 |
| 1000 | +175 | -125 |
| 3000 | +150 | -150 |
| 5000 | +125 | -175 |
| 10000 | +100 | -200 |
| 20000 | +50 | -250 |
| 30000 | 0 | -300 | ment
CYCLING ENDURANCE EXTENDING FOR MEMORY CELLS OF A NON-VOLATILE MEMORY ARRAY

BACKGROUND

Types of non-volatile memory such as NAND memory typically suffer from a limited number of program/erase cycle counts before these types of memory perform unacceptably and/or become unreliable. For example, some types of NAND memory store charge on a floating gate that is surrounded by an insulating oxide layer to keep the charges trapped. NAND memory operations depend on the quality of the oxide layer between a memory cell channel and the floating gate. As program/erase cycle counts increase the oxide layer progressively wears down or degrades due to charges (electrons/holes) flowing through the oxide layer at each program/erase cycle. This oxide layer degradation may result in slower erase operations, higher bit-error rates (BER) during programming and charge leakage from the floating gate. All three of these symptoms of oxide layer degradation may limit NAND memory endurance.

NAND memory endurance may also be limited by charge trapped in an oxide above a lightly doped drain (LDD) region of a NAND memory cell. Trapped charges may cause an apparent increase in resistance of a memory string (bitline). In a worst case, no current passes through the memory string and the memory string may appear as an open circuit. Appearing as an open circuit may lead to all bits on that memory string to read as programmed "0" even after erase operations. As a result of always reading as programmed, these memory cells will no longer be used.

DETAILED DESCRIPTION

As contemplated in the present disclosure, oxide layer degradation may limit the endurance of types of non-volatile memory such as NAND memory. Currently NAND memory endurance problems are addressed by improving fabrication processes, memory device settings, distributing memory cell usage or memory device testing methodologies. Also, error correction capabilities may be implemented on a system level to minimize the impacts of degraded memory cells. However none of the current techniques lower intrinsic NAND memory degradation or attempt to delay or slow down the negative effects of NAND memory degradation on memory cells as program/erase cycling counts increase.

In some examples, techniques are implemented for cycling endurance extending for memory cells of a non-volatile memory array (e.g., NAND memory). For these examples, a current program/erase cycle count for one or more memory cells of the non-volatile memory may be determined. The current program/erase cycle count may then be compared to a first target program/erase cycle count. One or more cycling endurance extending schemes may be implemented based on whether the current program/erase cycle count exceeds the first target program/erase cycle count or based on whether a failure trigger has been reached. The one or more cycling endurance extending schemes may include a gradual read window expansion, a gradual read window shift, an erase blank check algorithm, a dynamic soft-program or a dynamic pre-program.

Figure 1:
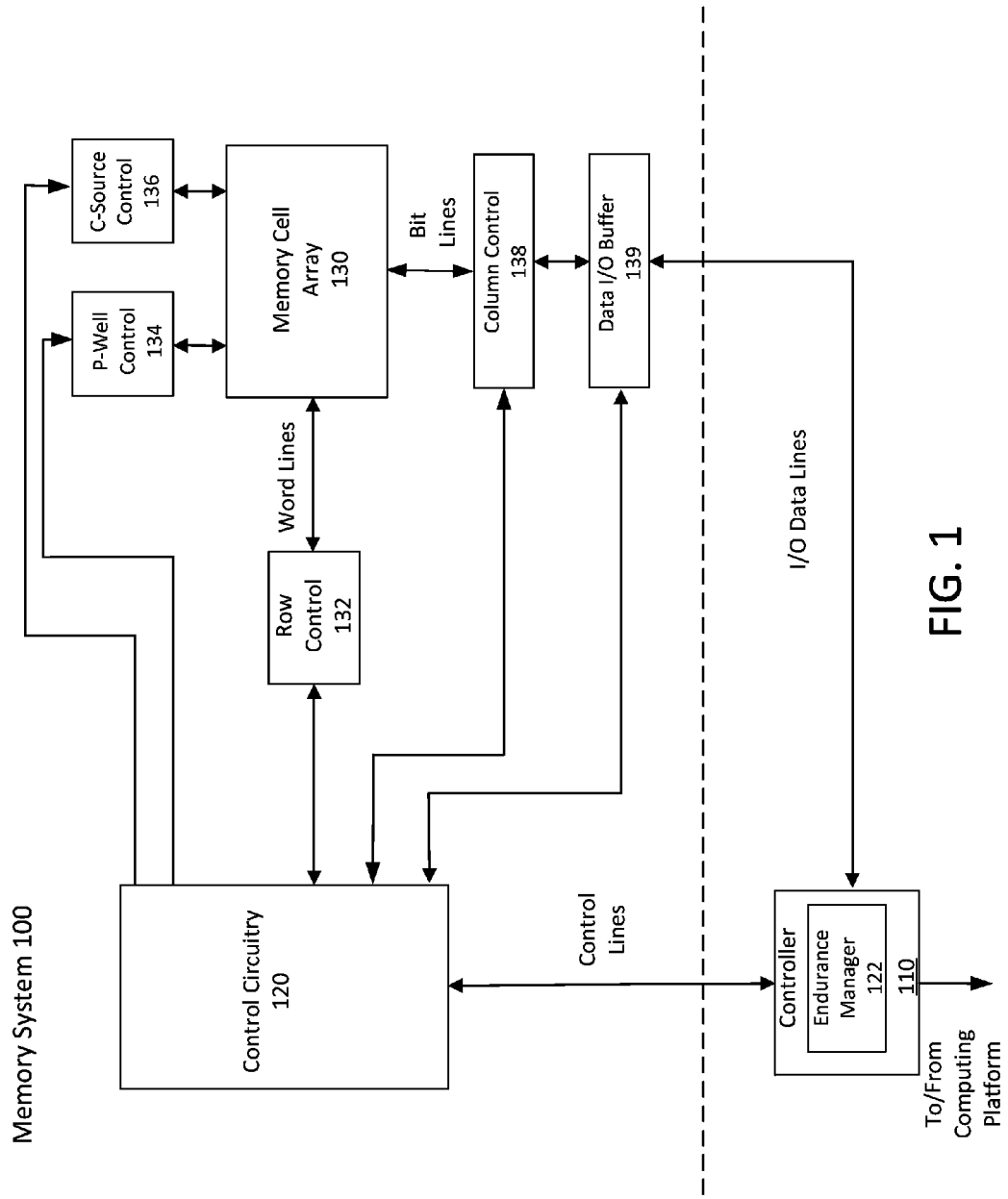
FIG. 1 illustrates an example memory system.

FIG. 1 illustrates a diagram of an example memory system 100. In some examples, as shown in FIG. 1, memory system 100 may include a controller 110, control circuitry 120, a memory array 130. In some examples, various memory operations performed by memory array 130 may be controlled by row control 132, p-well control 134, c-source control 136 and column control 138. Overall operations of memory array 130 may be controlled or directed by control circuitry 120 and/or controller 110. A data input/output buffer 139 may be configured to at least temporarily store data written to or read from memory cell array 130. Also, as shown in FIG. 1, controller 110 includes an endurance manager 112. As described more below, endurance manager 112 includes logic and/or features that may implement one or more cycling endurance extending schemes based on program/erase cycle counts (e.g., for memory cell array 130) or a failure trigger associated with one or memory cells included in memory cell array 130.

In some examples, memory array 130 may be a non-volatile type of memory such as NAND memory. For these examples, one or more memory cells included in memory array 130 may be configured to maintain a plurality of states or bits. The plurality of bits may be maintained or stored in the memory cells via implementation of either single-level cell (SLC) or multi-level cell (MLC) programming.

According to some examples, row control 132 may be coupled to word lines of memory array 130. For these examples, row control 132 may be coupled via the word lines to select one of the word lines, apply read voltages, apply program voltages combined with bit line potential levels controlled by column control 138, and apply erase voltage. Also, column control 138 may be coupled to bit lines of memory array 130 to read data stored in the memory cells, determine a state of the memory cells during a program operation, and control potential levels of the bit lines to promote or inhibit programming and erasing. P-well control may control the p-well voltage of memory array 130 and c-source control 136 may control a common source line coupled to memory array 130.

In some examples, column control 138 may be configured to read out data stored or maintained in memory array 130 and the data may be output to external I/O data lines via data I/O buffer 139. For these examples, program data to be stored in the memory cells of memory array 130 may be input to data I/O buffer 139 via the external I/O data lines and then transferred to column control 138. As shown in FIG. 1, in some examples, the external I/O data lines may be coupled to or managed by controller 110.

According to some examples, command data for controlling elements of memory system 100 such as memory array 130 may be relayed from controller 110 or elements of controller 110 (e.g., endurance manager 112) via control lines coupled to control circuitry 120. The control data, for examples, may inform the elements of memory system 100 as to what operation is requested.

In some examples, controller 110 may be coupled with or configured to couple with a host system such as a computing platform. The computing platform may be implemented as part of a server, a desktop computer, a personal computer (PC), a laptop computer, an ultra-mobile computer, a tablet, a touch pad, a portable computer, a handheld computer, a palmtop computer, a personal digital assistant (PDA), a cellular telephone, a combination cellular telephone/PDA, television, a smart device (e.g., smart phone, smart tablet or smart television), a mobile internet device (MID), a messaging device, a data communication device, and so forth. For these examples, controller 110 may communicate with elements of the computing platform to read data from or write data to memory array 130. Controller 110 may be configured to receive commands from the computing platform and forward the commands to control circuitry 120. Controller 110 may also be configured to control I/O data lines between memory system 100 and the computing platform.

According to some examples, memory system 100 may be incorporated as an integrated system that includes controller 110 on a single circuit board or other type of integrated packaging. For these examples, the integrated system may include a plurality of memory arrays 130 and associated control circuitry. The integrated system may be embedded as part of a computing platform or may be included in a type of configuration (e.g., memory card or solid state disk drive (SSD)) that may removably couple to a computing platform. This type of configuration may include all of the elements of memory system 100 depicted in FIG. 1 or just the elements above the dotted-line. Controller 110 may therefore be embedded with the computing platform or may be included in a memory system that is removable from the computing platform.

Figure 2:
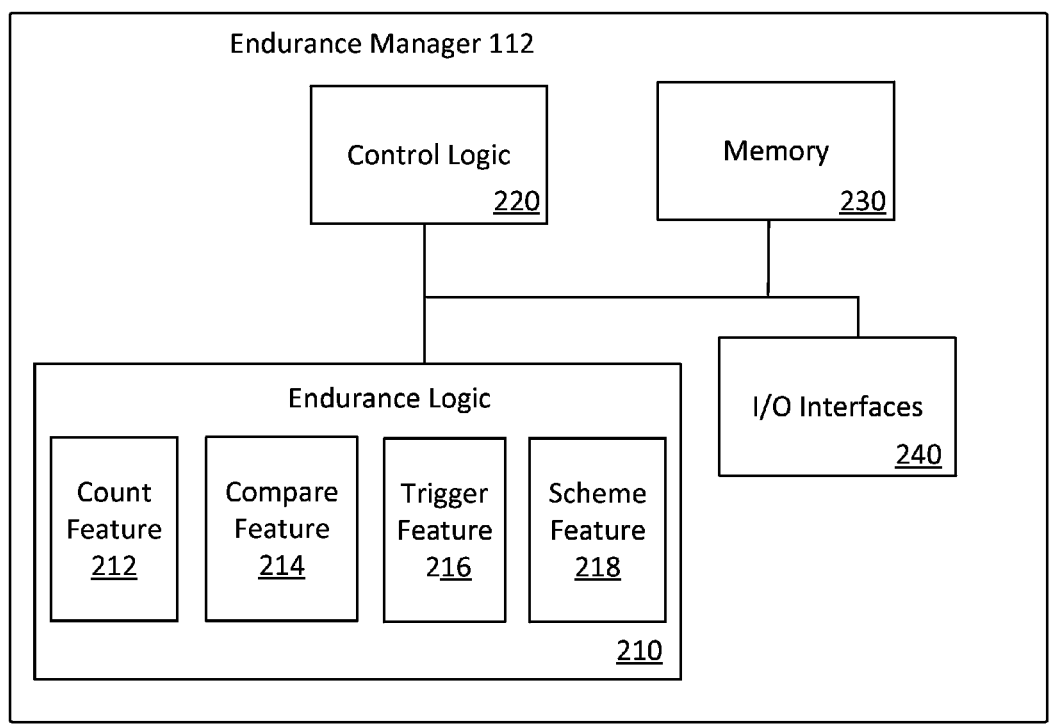
FIG. 2 illustrates a block diagram of an example architecture for an endurance manager.

FIG. 2 illustrates a block diagram of an example architecture for endurance manager 112. In some examples, endurance manager 112 includes features and/or logic configured or arranged for cycling endurance extending of memory cells of a non-volatile memory array. Endurance manager 112 may also include features and/or logic configured to implement one or more endurance extending schemes based on program/erase cycle counts or a failure trigger associated with the memory cells of the non-volatile memory array.

According to some examples, as shown in FIG. 2, endurance manager 112 includes endurance logic 210, control logic 220, a memory 230 and input/output (I/O) interfaces 240. As illustrated in FIG. 2, endurance logic 210 may be coupled to control logic 220, memory 230 and I/O interfaces 240. Endurance logic 210 may include one or more of a count feature 212, a compare feature 214, a trigger feature 216 or a scheme feature 218, or any reasonable combination thereof.

In some examples, the elements portrayed in FIG. 2 are configured to support or enable endurance manager 112 as described in this disclosure. A given endurance manager 112 may include some, all or more elements than those depicted in FIG. 2. For example, endurance logic 210 and control logic 220 may separately or collectively represent a wide variety of logic device(s) or executable content to implement the features of endurance manager 112. Example logic devices may include one or more of a microprocessor, a microcontroller, a processor circuit, a field programmable gate array (FPGA), an application specific integrated circuit (ASIC), a sequestered thread or a core of a multi-core/multi-threaded microprocessor or a combination thereof.

In some examples, as shown in FIG. 2, endurance logic 210 includes count feature 212, a compare feature 214, trigger feature 216 or scheme feature 218. Endurance logic 210 may be configured to use one or more of these features to perform operations. For example, count feature 212 may determine a current program/erase cycle count for memory cells of a memory array. Compare feature 214 may compare the current program/erase cycle count and determine whether the current program/erase cycle count exceeds a target program/erase cycle count. Trigger feature 216 may determine whether a failure trigger has been detected or indicated for at least some of the memory cells of the memory array. Scheme feature 218 may implement one or more cycling endurance extending schemes based on the current program/erase cycle count exceeding the target program/erase cycle count or based on a failure trigger.

In some examples, control logic 220 may be configured to control the overall operation of endurance manager 112. As mentioned above, control logic 220 may represent any of a wide variety of logic device(s) or executable content. For some examples, control logic 220 may be configured to operate in conjunction with executable content or instructions to implement the control of endurance manager 112. In some alternate examples, the features and functionality of control logic 220 may be implemented within endurance logic 210.

According to some examples, memory 230 may be arranged to store executable content or instructions for use by control logic 220 and/or endurance logic 210. The executable content or instructions may be used to implement or activate features or elements of endurance manager 112. As described more below, memory 230 may also be arranged to at least temporarily maintain information associated with maintaining read window extension tables, read window shifting tables, program/erase trim sets or program/erase trim profiles. Memory 230 may also be arranged to at least temporarily maintain information associated with maintaining program/erase cycle counts.

Memory 230 may include a wide variety of non-volatile memory media including, but not limited to, one or more types of flash memory, programmable variables or states, read-only memory (ROM), or other types of static storage media. In some examples, if implemented in a computing platform without power constraints (e.g., large battery or power cord), memory 230 may include a wider variety of memory media that may also include types of volatile memory, such as dynamic random access memory (DRAM) or other types of dynamic storage media.

In some examples, I/O interfaces 240 may provide an interface via a local communication medium or link between endurance manager 112 and elements of memory system 100 depicted in FIG. 1 or elements of a host or computing platform. I/O interfaces 240 may include interfaces that operate according to various communication protocols or standards to communicate over the local communication medium or link. These communication protocols or standards may be described in one or one or more industry standards (including progenies and variants) such as those associated with the Open NAND Flash Interface Specification (ONFi), the Inter- Integrated Circuit (I²C) specification, the System Management Bus (SMBus) specification, the Accelerated Graphics Port (AGP) specification, the Peripheral Component Interconnect Express (PCI Express) specification, the Universal Serial Bus (USB), specification or the Serial Advanced Technology Attachment (SATA) specification. Although this disclosure is not limited to only the above-mentioned standards and associated protocols.

Figure 3:
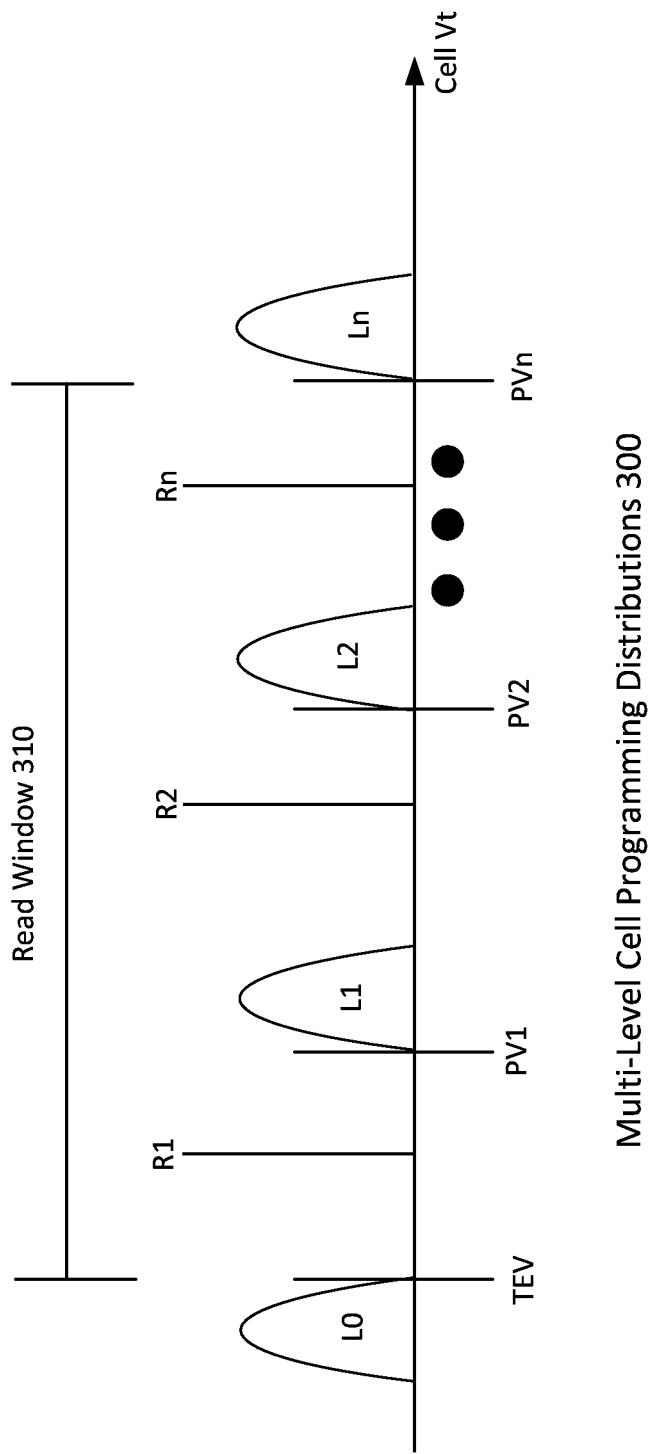
FIG. 3 illustrates example multi-level cell programming distributions.

FIG. 3 illustrates example multi-level cell programming distributions 300. As shown in FIG. 3, cell programming distributions 300 includes levels L0 to Ln, read references R1 to Rn, program voltages PV1 to PVn and an erase threshold voltage (TEV). In some examples "n" may indicate the number of levels maintained in a multi-level cell and may be determined by n=2^m where "m" is any positive integer greater than 1. Also, as shown in FIG. 3, along the horizontal axis, cell threshold voltage (Vt) is shown as increasing from right to left.

In some examples, as shown in FIG. 3, multi-level cell programming distributions 300 includes a read window 310. For these examples, read window 310 indicates a threshold voltage range between TEV and PVn. Read window 310 may indicate the Vt needed to read programmed values distributed in a multi-level cell between L0 to Ln.

In some examples, a type of non-volatile memory such as NAND memory having memory cells using multi-level cell programming distributions 300 may have an program/erase cycling endurance that is proportional to the size (Vt range) of read window 310. For example, a larger read window 310 requires a higher Vt to read PVn and oxide layer degradation for floating gates associated with these memory cells may occur at a faster rate. Thus, the larger the size of read window 310, the shorter program/erase cycling endurance may be for the memory cells. Also, according to some examples, at increasing program/erase cycle counts, oxide layer degradation may cause one or more failure triggers for at least some of the memory cells. The one or more failure triggers may result in these memory cells no longer being used and thus may also shorten program/erase cycling endurance for the memory cells.

As described more below, various aspects of read windows associated with multi-level cell programming distributions similar to multi-level cell programming distributions 300 may be manipulated to reduce oxide layer degradation and possibly extend or increase the program/erase cycling endurance for the memory cells. Also, one or more types of cycling endurance extending schemes may be implemented that may include manipulating/adjusting the read windows and/or possibly continue to use at least some memory cells associated with failure triggers. According to some examples, the one or more types of cycling endurance extending schemes may be implemented by logic and/or features of endurance manager 112 based on an program/erase cycle count or responsive to a failure trigger.

According to some examples, characteristics associated with memory structures configured for non-volatile memory may be exploited to extend the program/erase cycling endurance for the memory cells. For example, narrower (smaller Vt range) read windows may be possible when memory cells have experienced a lower number of program/erase cycles. Also, a read reference Vt for higher levels (e.g., R3 if m=2) may be such that higher program Vt can be closer (e.g., at a lower Vt) to the read reference Vt at lower program/erase cycle counts. As described in examples below, both these characteristics may enable a read window to be either expanded or shifted based on program/erase cycle counts.

Figures 4, 5:
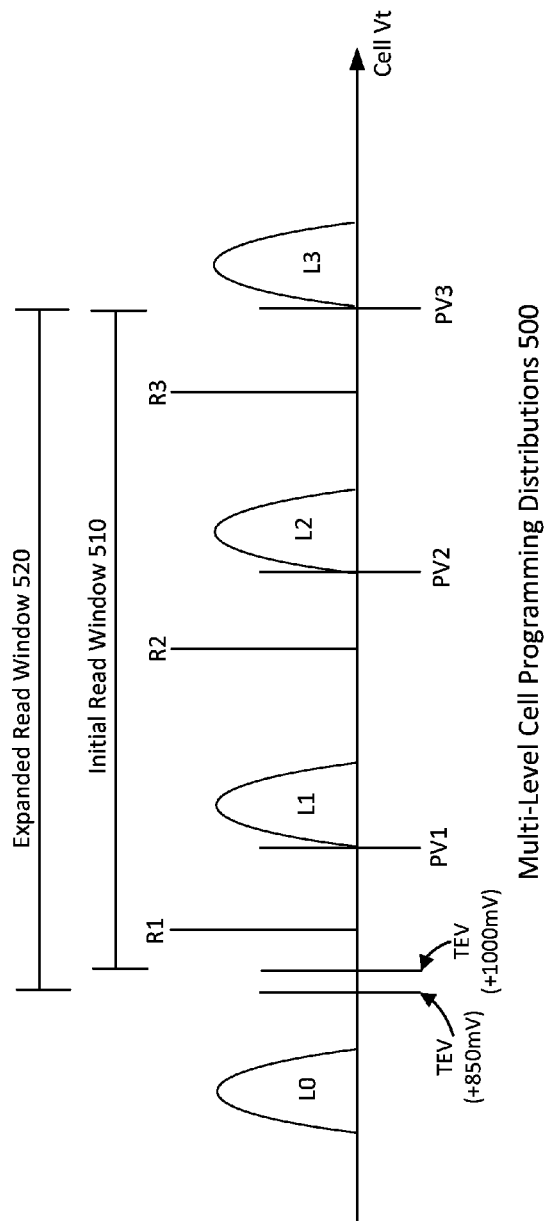
FIG. 4 illustrates an example erase threshold voltage (TEV) read window expansion table.
FIG. 5 illustrates example multi-level cell programming distributions with an extended read window based on adjustments to TEV.

FIG. 4 illustrates an example TEV read window expansion table 400. As shown in FIG. 4, TEV read window expansion table 400 includes a column for target cycle counts and a column for TEV adjust. In some examples, the target cycle counts may correspond to program/erase cycle counts for memory array 130 shown in FIG. 1 and TEV adjust may correspond to incremental adjustment to TEV in millivolts (mV). For these examples, the TEV adjustment may be associated with multi-level cell programming distributions utilized by one or more memory cells of memory array 130 and may be used (e.g., by endurance manager 112) to incrementally expand a Vt range (e.g., read window) to read programmed values from the one or more memory cells.

FIG. 5 illustrates example multi-level cell programming distributions 500 with an extended read window based on adjustments to TEV. In some examples, an initial read window 510 and an expanded read window 520 associated with a TEV expansion of +1000 mV and +850 mV, respectively are shown. For these examples, a total of four levels L0 to L3, three programming voltages P1 to P3, and three read references R1 to R3 are included in multi-level cell programming distributions 500.

According to some examples, both initial read window 510 and expanded read window 520 may be part of a cycling endurance extending scheme implemented by logic and/or features of endurance manager 112 to extend the endurance of one or more memory cells of memory array 130. For these examples, the target cycle counts and TEV adjust values shown in FIG. 4 for TEV read window expansion table 400 may be used by endurance manager 112 to incrementally expand a read window.

In some examples, the one or more memory cells of memory array 130 may utilize multi-level cell programming distributions 500. For these examples, when the memory cells are first used (e.g., program/erase count is 1) initial read window 510 may be established that includes adjusting or moving TEV +1000 mV away from the right edge of the L0 cell. As mentioned above, characteristics of the memory cells at lower program/erase counts may enable the read window to be adjusted. In this case, moving the TEV towards R1 by +1000 mV may cause little to no errors or failure triggers for program/erase counts between 1 and 1000. The +1000 mV expansion may compresses or shorten initial read window 510 compared to having a read window that starts at the right edge of the L0 cell.

According to some examples, endurance manager 112 may include logic and/or features to incrementally adjust a read window for multi-level cell programming distributions 500 to result in expanded read window 520. As shown in FIG. 5, TEV is shifted from +1000 mV to +850 mV. Hence, expanded read window 520 now has a Vt range that is 150 mV larger that the Vt range for initial read window 510. Using TEV read window expansion table 400 as a guide, endurance manager 112 may make further adjusts to the read window at 3000, 5000, 10000, 20000 or 30000 program/erase cycle counts. This disclosure is not limited to the cycle counts or TEV expansions shown in FIG. 4 and FIG. 5. Any number of combinations of cycle counts and TEV expansions may be implemented provided the combinations do not lead to unacceptably high program/erase errors for memory cells utilizing multi-level cell programming distributions similar to multi-level cell programming distributions 500.

Figures 6, 7:
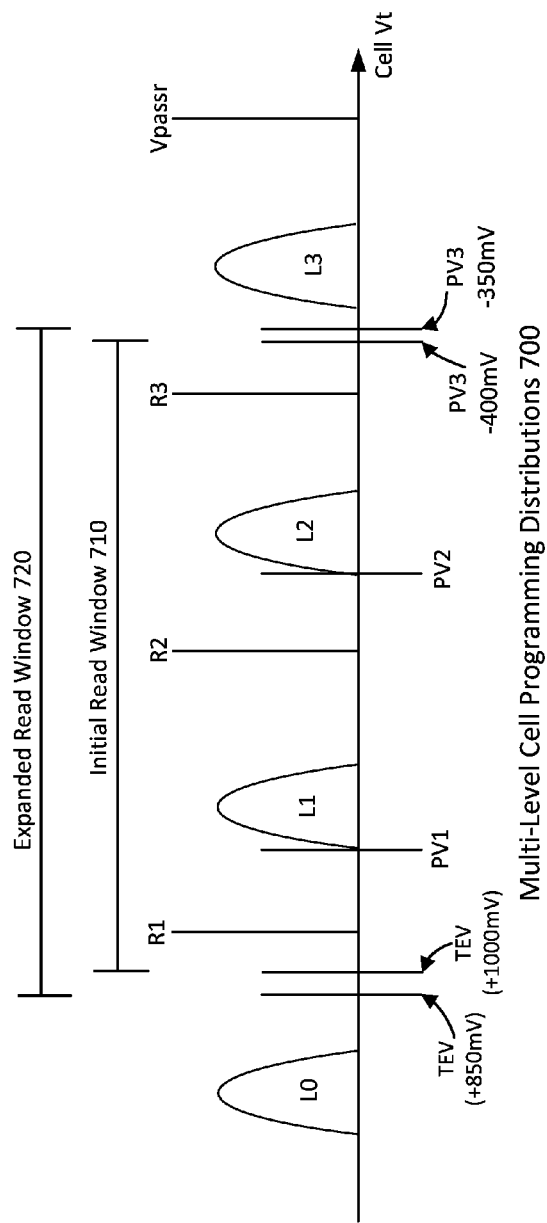
FIG. 6 illustrates an example TEV/program threshold voltage (PV) read window expansion table.
FIG. 7 illustrates example multi-level cell programming distributions with an extended read window based on adjustments to TEV/PV.

FIG. 6 illustrates an example TEV/PV read window expansion table 600. As shown in FIG. 6, TEV/PV read window expansion table 600 includes a column for target cycle counts, a column for TEV adjust and a column for PV 3 adjust. In some examples, similar to TEV read window expansion table 400, the target cycle counts may correspond to program/erase cycle counts for memory array 130, TEV expand may correspond to incremental adjustments in TEV in millivolts (mV). Different from window expansion table 400, TEV/PV read window expansion table 600 also includes indications for a corresponding incremental adjustment in PV3. For these examples, the TEV/PV3 adjustments may be associated with multi-level cell programming distributions utilized by one or more memory cells of memory array 130 and may be used (e.g., by endurance manager 112) to incrementally expand a Vt range (e.g., read window) to read programmed values from the one or more memory cells.

FIG. 7 illustrates example multi-level cell programming distributions 700 with an expanded read window based on adjustments to TEV and PV3. In some examples, an initial read window 710 and an expanded read window 720 associated with TEV adjustments of +1000 mV/+850 Mv and PV3 adjustments of −350 mV/−400 mv, respectively are shown. For these examples, similar to FIG. 5, levels L0 to L3, P1 to P3, and R1 to R3 are included in multi-level cell programming distributions 700. Also shown in FIG. 7 is Vpassr. Vpassr (sometimes referred to as Vread) may represent a voltage applied on the unselected wordlines of a non-volatile memory such as NAND memory during a read operation.

According to some examples, both initial read window 710 and expanded read window 720 may be part of a cycling endurance extending scheme implemented by endurance manager 112. For these examples, the target cycle counts and TEV adjust values shown in FIG. 6 for TEV/PV read window expansion table 600 may be used by endurance manager 112 to incrementally expand read windows for memory cells utilizing multi-level cell programming distributions 700.

In some examples, the one or more memory cells of memory array 130 may utilize multi-level cell programming distributions 700. For these examples, similar to FIG. 5, initial read window 710 may include an adjusted TEV of +1000 mV. Additionally, PV3 may be adjusted away from the left edge of the L3 cell. As mentioned above characteristics of the memory cells at lower program/erase counts may enable the read window to be adjusted. In this case, adjusting the PV3 towards R3 by 400 mV may cause little to no errors or failure triggers for program/erase counts between 1 and 1000. The −400 mV PV3 adjustment along with the +1000 mV TEV adjustment causes an even greater compression of initial read window 710 compared to initial read window 510 shown in FIG. 5.

According to some examples, endurance manager 112 may include logic and/or features to incrementally adjust a read window for multi-level cell programming distributions 700 to result in expanded read window 720. As shown in FIG. 7, TEV is adjusted from +1000 mV to +850 mV and PV3 is adjusted from −400 mV to −350 mV. Hence, expanded read window 720 now has a Vt range that is 200 mV larger that the Vt range for initial read window 710. Using TEV/PV read window expansion table 600 as a guide, endurance manager 112 may make further adjusts to read window at 3000, 5000, 10000, 20000 or 30000 program/erase cycle counts. Although, this disclosure is not limited to only the cycle counts or TEV/PV shifts shown in FIG. 6 and FIG. 7.

Figure 8:
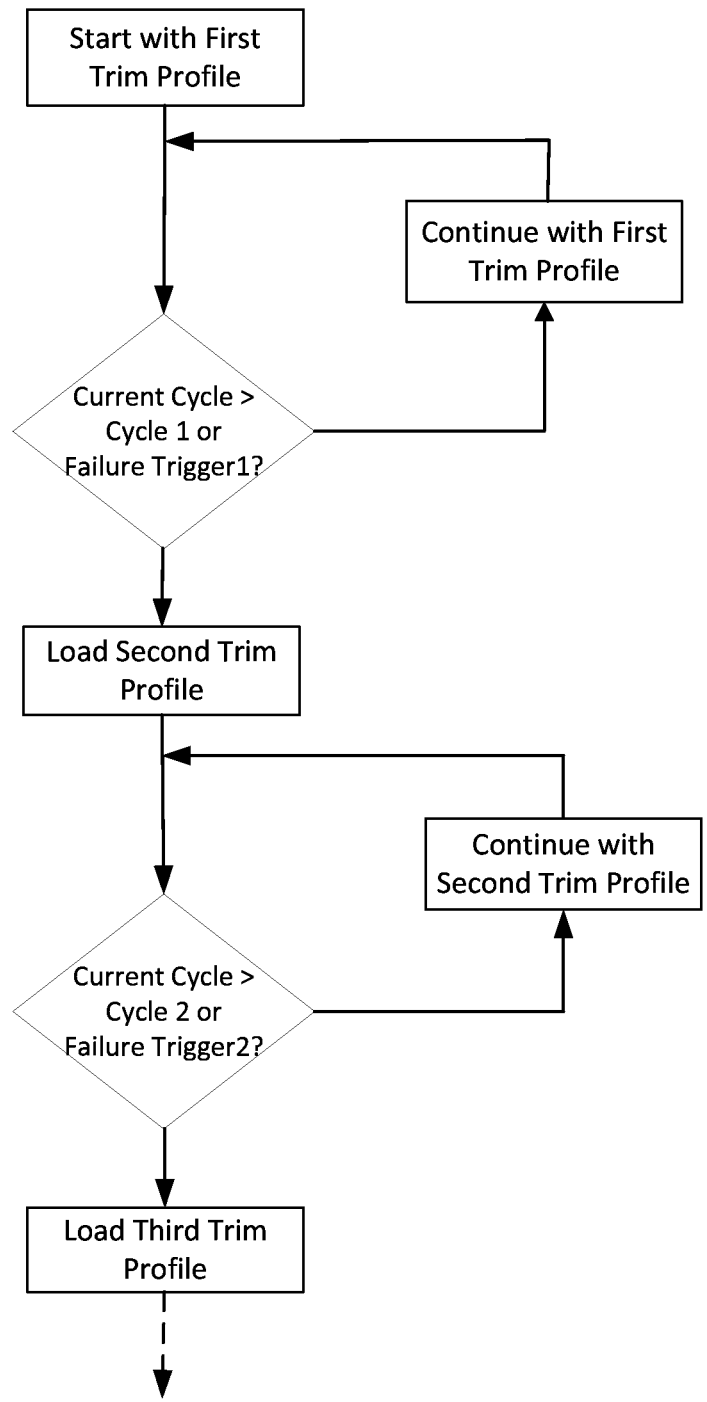
FIG. 8 illustrates an example flow diagram for loading various trim profiles.

FIG. 8 illustrates an example flow diagram 800 for loading various trim profiles. In some examples, any number of combinations of cycle counts and TEV/PV/Vpassr adjustments may be implemented, provided the combinations do not lead to unacceptably high program/erase errors for memory cells utilizing multi-level cell programming distributions similar to multi-level cell programming distributions 700 mentioned above. For these examples, combinations of TEV/PV/Vpassr may be incorporated in various trim profiles via which one or more memory cells may be operated. These various trim profiles may include an erase trim set, adjusted program thresholds, a program trim set and a Vpassr voltage. According to some examples, as shown in FIG. 8, as cycle counts or failure triggers are reached, different trim profiles may be loaded.

In some example, lower Vpassr voltage may be associated with trim profiles implemented at lower cycle counts. For these examples, lowering Vpassr voltages at lower cycle counts improves read disturb endurance of types of non-volatile memory such as NAND memory. As a result of lower Vpassr voltages at lower cycle counts, read disturb endurance for NAND memory cells can be improved.

Figures 9, 10:
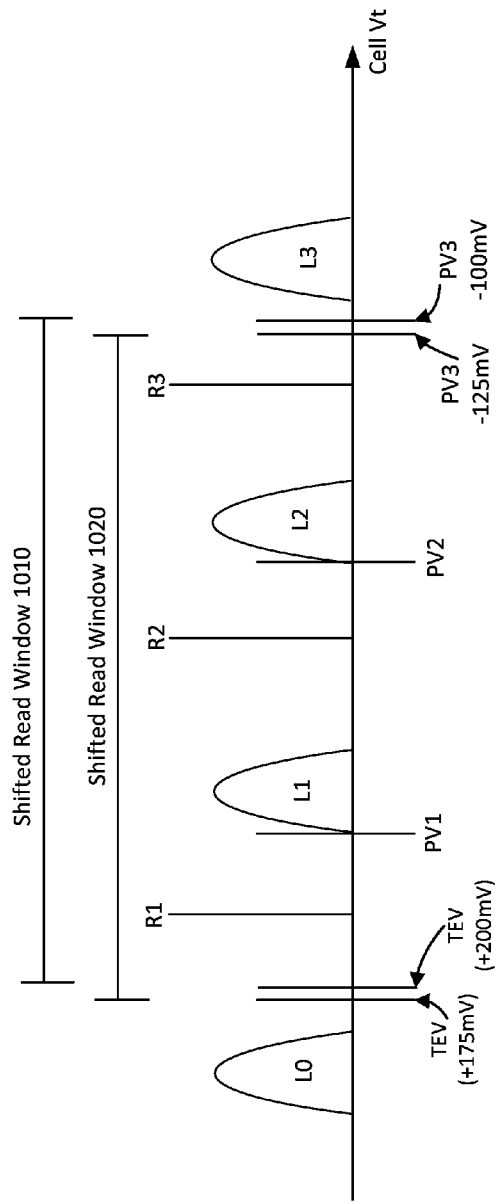
FIG. 9 illustrates an example TEV/PV read window shift table.
FIG. 10 illustrates example multi-level cell programming distributions with a shifted read window based on adjustments to TEV/PV.

FIG. 9 illustrates an example TEV/PV read window shift table 900. As shown in FIG. 9, TEV/PV read window shift table 900 includes a column for target cycle counts, a column for TEV adjust and a column for PV3 adjust. In some examples, similar to the expansion tables shown in FIGS. 4 and 6, the target cycle counts may correspond to program/erase cycle counts for memory array 130, TEV/PV adjustments may correspond to incremental shifts in TEV and PV3 in millivolts (mV). Different from the expansion tables shown in FIG. 6, TEV/PV read window shift table 900 allows for a read window that maintains the same size or width rather than expands at higher program/erase cycle counts. For these examples, the TEV/PV3 adjustments may be associated with multi-level cell programming distributions utilized by one or more memory cells of memory array 130 and may be used (e.g., by endurance manager 112) to incrementally shift a Vt range (e.g., read window) to read programmed values from the one or more memory cells.

FIG. 10 illustrates example multi-level cell programming distributions 1000 with an expanded read window based on adjustments to TEV and PV3. In some examples, a shifted read window 1010 and a shifted read window 1020 associated with TEV adjustments of +200 mV/+175 mV and PV3 adjustments of −100 mV/−125 mv, respectively are shown. For these examples, similar to FIGS. 5 and 7, levels L0 to L3, P1 to P3, and R1 to R3 are included in multi-level cell programming distributions 1000.

According to some examples, both shifted read window 1010 and shifted read window 1020 may be part of a cycling endurance extending scheme implemented by endurance manager 112. For these examples, the target cycle counts and TEV adjust values shown in FIG. 10 for TEV/PV read window shift table 1000 may be used by endurance manager 112 to incrementally shift read windows for memory cells utilizing multi-level cell programming distributions 1000.

In some examples, the one or more memory cells of memory array 130 may utilize multi-level cell programming distributions 1000. For these examples, shifted read window 1010 may include an initially adjusted TEV of +200 mV and an adjusted PV3 of −100 mV. As mentioned above, characteristics of the memory cells at lower program/erase counts may enable both the TEV and the read window to be adjusted. In this case, shifting the TEV towards R1 by +200 mv and shifting PV3 towards R3 by −100 mV may cause little to no errors or failure triggers for program/erase counts between 1 and 1000.

According to some examples, endurance manager 112 may include logic and/or features to incrementally adjust a read window for multi-level cell programming distributions 1000 to result in shifted read window 1020 (e.g., after target cycle count of 1000 has been exceeded). As shown in FIG. 10, TEV is adjusted from +200 mV to +175 mV and PV3 is adjusted from −100 mV to −125 mV. Hence, shifted read window 1020 still has the same Vt range as shifted read window 1010 but PV3 has shifted farther from the left edge of L3 and closer to the right edge of L0. Using TEV/PV read window expansion table 1000 as a guide, endurance manager 112 may make further adjusts to read window at subsequent program/erase cycle counts. This disclosure is not limited to the cycle counts or TEV/PV adjustments shown in FIG. 9 and FIG. 10. Any number of combinations of cycle counts and TEV/PV shifts may be implemented provided the combinations do not lead to unacceptably high program/erase errors for memory cells utilizing multi-level cell programming distributions similar to multi-level cell programming distributions 1000.

According to some examples, endurance manager 112 may include logic and/or features to either shift or expand a read window based on other criteria besides just program/erase cycle counts. For these examples, one or more failure triggers may cause endurance manager 112 to implement one or more cycling endurance extending schemes that may include shifting or expanding a read window as mentioned above. For example, a maximum bit error rate or a block fail for one or more memory cells of memory array 130 may indicate that the current read window is either causing excessive program/erase errors at L0 and/or L3 associated with multi-level cell programming distributions 500, 700 or 1000. Rather than wait for a given target cycle count to be reached, the read window may be extended or shifted.

In some examples, endurance manager 112 may include logic and/or features to load various trim sets or profiles upon either reaching a target program/erase count or responsive to a failure trigger. For these examples, the various trim sets or profiles may include information for operating the one or more memory cells in order to shift or expand the read window. For example, shifting or expanding TEV may include the loading of an erase trim set that includes a start erase gate voltage for the one or more memory cells, a step size and a pulse width for the erase cycle.

For other examples where both the TEV and PV3 are shifted or expanded, a trim profile may be loaded that includes an erase trim set, information for adjustments to PV3 and a program trim set for PV1, PV2 and PV3. Similar to the erase trim set, step sizes and pulse widths for PV1, PV2 and PV3 may be included in the program trim set. The trim profile may also include other information associated with R1 to R3 or program inhibit values (e.g., Vpassr) associated with the one or more memory cells operating according to the trim profile.

In some examples, other than read window shifting or expanding, other cycling endurance extending schemes may be implemented. These other cycling endurance extending schemes may include use of an erase blank check algorithm, a dynamic soft-program or a dynamic pre-program.

According to some examples, an erase blank check algorithm may be implemented based on block erase verify failures. For these examples, these block erase verify failures may be attributed to degraded oxide in the lightly doped drain (LDD) region of the one or more memory cells of memory 130. The degraded oxide may result in trapped charges and cause a first block erase verify failure when a first voltage is applied (e.g., approximately 2V). Implementation of the erase blank check algorithm may include endurance manager 112 having logic and/or features to apply a second, higher voltage (e.g., approximately 6V) to the one or more memory cells and then determine whether a second block erase verify failure has occurred. Endurance manager 112 may then identify the block associated with the one or more memory cells as passing or failing erase verify based on the determination of whether the second block erase failure has occurred. If identified as passing, the endurance of the one or more memory cells may be extended because the one or more memory cells may still be used rather than being marked as error prone and no longer used.

In some examples, a dynamic soft-program may be implemented to extend the endurance of the one or more memory cells by stopping soft program of the or more memory cells once a given target program/erase cycle count has been exceeded. For these examples, soft program may have occurred after erase operations to compact the erase distribution and may include a relatively small voltage pulse before the erase operation. After higher program/erase counts, soft-program may not be necessary and stopping soft-program may extend the endurance of the one or more memory cells.

According to some examples, a dynamic pre-program may also be implemented to extend the endurance of the one or more memory cells. For these examples, pre-program may be selectively performed on the one or more memory cells once a given target program/erase cycle count has been exceeded. Selectively performing pre-program may include performing pre-program only where the one or more memory cells were partially programmed and erased.

Figure 11:
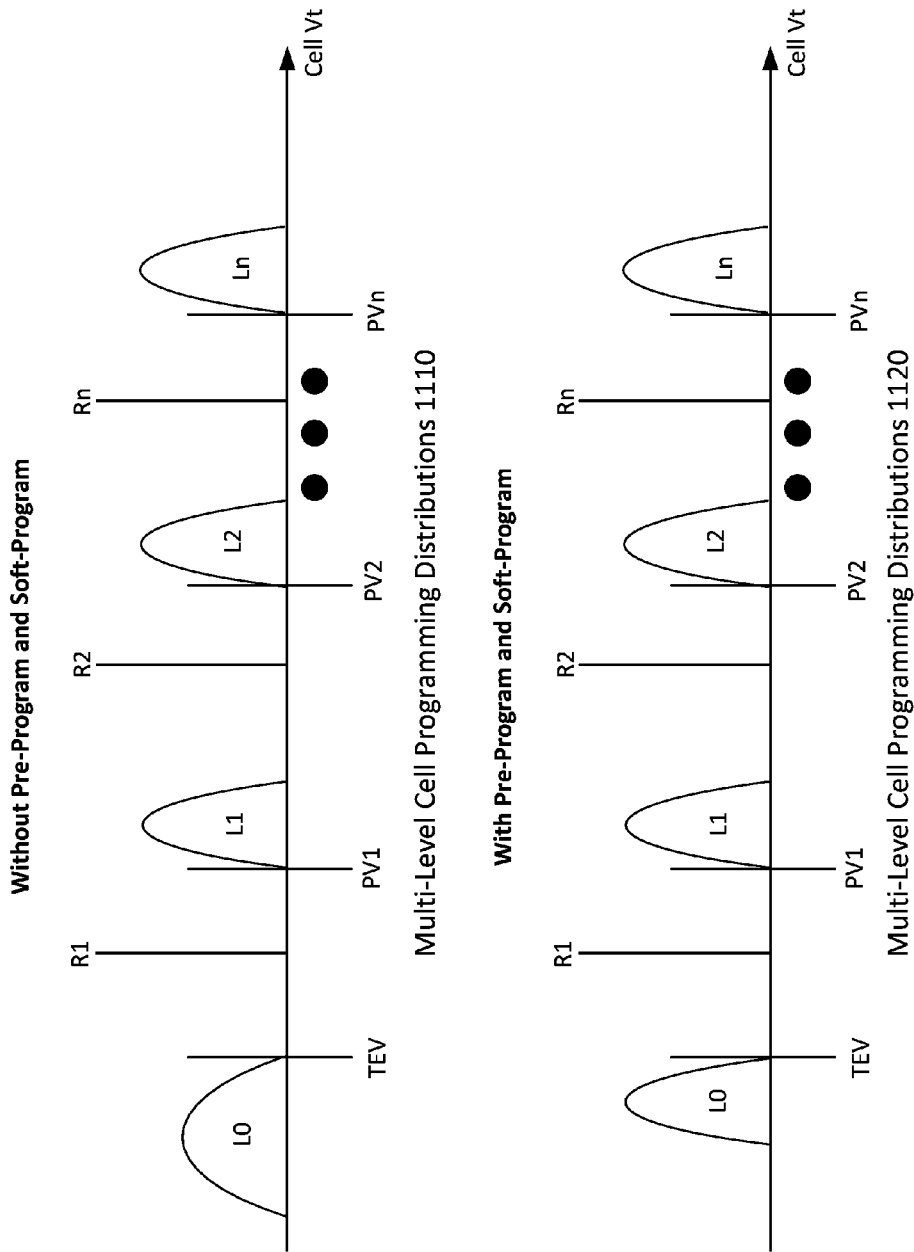
FIG. 11 illustrates example multi-level cell programming distributions with and without pre-program and soft-program.

FIG. 11 illustrates example multi-level cell programming distributions with and without pre-program and soft-program. In some examples, as shown in FIG. 11, multi-level cell programming distributions 1110 and 1120 depict the shape of level L0 without and with pre-program and soft-program. For these examples, pre-program and soft-program may result in the use of mild programming pulses to tighten an erase distribution. As mentioned above, implementing cycling endurance extending schemes such as dynamic pre-program and soft-program may extend the program/erase endurance of the one or more memory cells.

Figure 12:
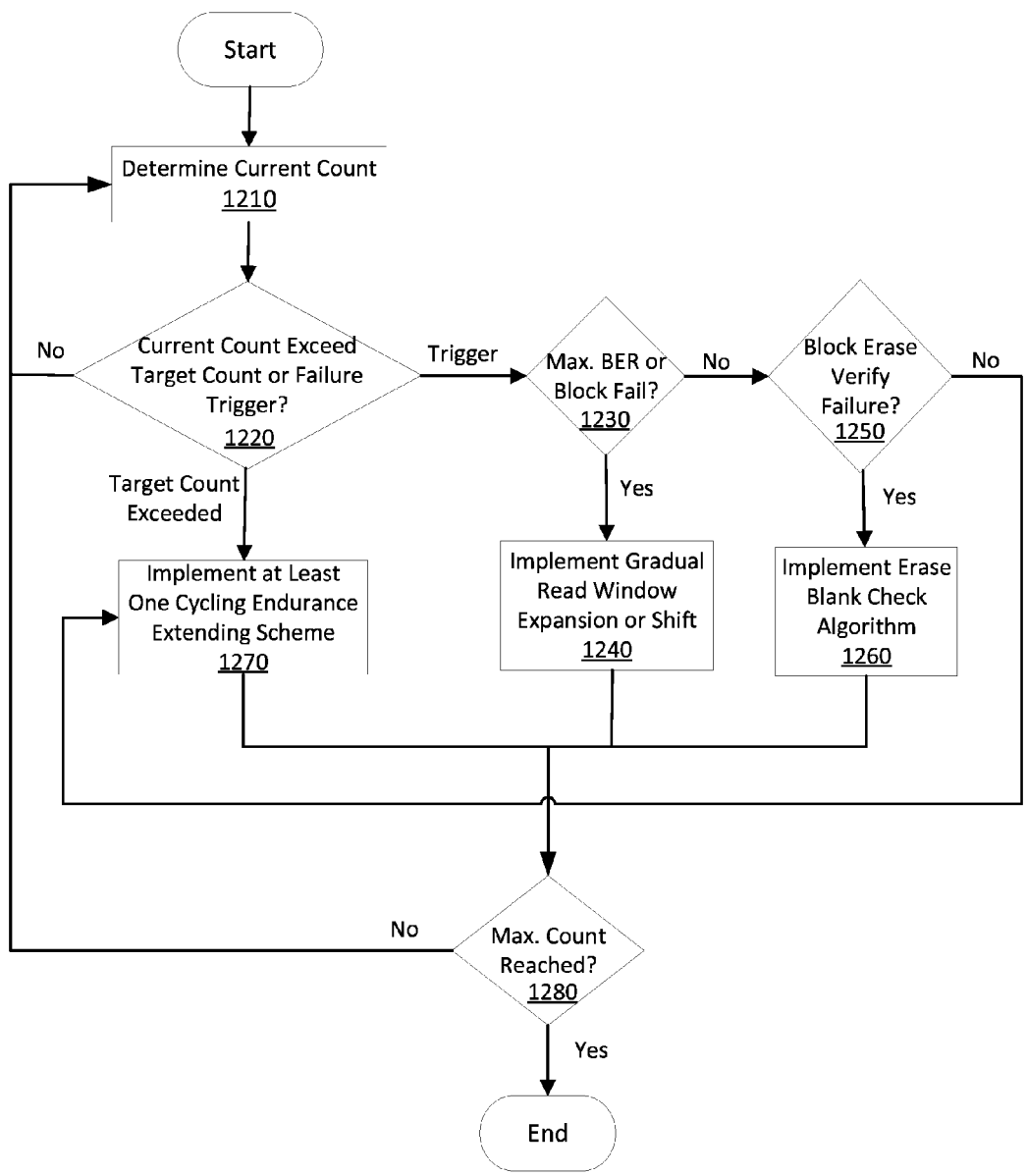
FIG. 12 illustrates a flow chart of example operations for cycling endurance extending of one or more memory cells of a non-volatile memory array.

FIG. 12 illustrates a flow chart of example operations for cycling endurance extending of one or more memory cells of a non-volatile memory array. In some examples, elements of memory system 100 as shown in FIG. 1 may be used to illustrate example operations related to the flow chart depicted in FIG. 12. Endurance manager 112 as shown in FIG. 1 and FIG. 2 may also be used to illustrate the example operations. Multi-level cell programming distributions 500, 700 or 1000, TEV read window expansion table 400, TEV/PV read window expansion table 600 or TEV/PV read window shift table 900 shown in FIGS. 4-7 and 9-10 may also be used to illustrate the example operations. But the described example operations are not limited to implementations on memory system 100, endurance manager 112 or to the distributions or tables shown in FIGS. 4-7 and 9-10.

Moving from the start to block 1210 (Determine Current Count), endurance manager 112 may include logic and/or features configured to determine a current program/erase cycle count for memory cells of memory array 130 (e.g., via count feature 212). In some examples, the current count may be at least temporarily maintained in a memory (e.g., memory 230).

Proceeding from block 1210 to decision block 1220 (Current Count Exceed Target Count or Failure Trigger?), endurance manager 112 may include logic and/or features configured to determine whether the current count has exceeded a given target count (e.g., via compare feature 212) or whether a failure trigger has been detected or indicated for at least some of the memory cells (e.g., via trigger feature 214). For example, a target cycle count of 1200 may be the given target count. For these examples, if the current count does not exceed the target cycle count of 1200 or a failure trigger is detected/indicated, the process moves to block 1210. If a failure trigger is detected/indicated, the process moves to decision block 1230. Alternatively, if the current count does exceed the target cycle count the process moves to block 1270.

Proceeding from decision block 1220 to decision block 1230 (Max. BER or Block Fail?), endurance manager 112 may include logic and/or features configured to determine whether the failure trigger was associated with a maximum bit error rate (BER) or a block fail (e.g., via trigger feature 216). In some examples, if maximum BER or a block fail was the cause the process moves to block 1240. Otherwise, the process moves to decision block 1250.

Moving from decision block 1230 to block 1240 (Implement Gradual Read Window Expansion or Shift), endurance manager 112 may include logic and/or features configured to implement a gradual read window expansion or shift (e.g., via scheme feature 218). In some examples, a maximum BER or block fail failure trigger may be the result of a read window that may need to be expanded or shifted to reduce bit errors and/or block fails for a memory block associated with the one or more memory cells. For these examples, rather than wait for the next target cycle count to be exceeded, a read window for the one or more memory cell may be expanded or shifted to possibly reduce bit errors and/or number of block fails.

Moving from decision block 1230 to decision block 1250 (Block Erase Verify Failure?), endurance manager 112 may include logic and/or features configured to determine whether the failure trigger was due to a block erase verify failure for a memory block associated with the one or more memory cells (e.g., via trigger feature 216). If the trigger failure was due to a block erase failure, the process moves to block 1260. Otherwise the process moves to block 1270.

Moving from decision block 1250 to block 1260 (Implement Erase Blank Check Algorithm), endurance manager 112 may include logic and/or features configured to implement an erase blank check algorithm on the one or more memory cells (e.g., via scheme feature 218). As mentioned previously, a block erase verify failure may have resulted using a relatively low first gate voltage (e.g., approximately 2V) to conduct the block erase verify. In some examples, endurance manager 112 may apply a second gate voltage to the one or more memory cells that is higher than the first voltage (e.g., approximately 6V) and a determination may then be made as to whether the one or more memory cells will pass or fail an erase verify at the higher second gate voltage.

Moving from decision block 1220 or from decision block 1250 to block 1270 (Implement at Least One Cycling Endurance Extending Scheme), endurance manager 112 may include logic and/or features configured to implement at least one of the cycling endurance extending schemes (e.g., via scheme feature 218). In some examples, endurance manager 112 may implement at least one of the schemes or various combinations of the schemes. These schemes may include a gradual read window expansion, a gradual read window shift, a dynamic soft-program or a dynamic pre-program. For some examples, the number of schemes implemented may increase as program/erase cycle counts reach higher levels. For other examples, the number of schemes implemented may decrease as program/erase cycle counts reach higher levels.

Proceeding from blocks 1240, 1260 or 1270 to decision block 1280 (Max. Count Reached?), endurance manager 112 may include logic and/or features configured to determine whether the one or more memory cells have reached the maximum program/erase count (e.g., via count feature 212). In some examples, the one or more memory cells may be disabled due to dependability concerns after exceeding a maximum program/erase count. If the current program/erase count exceeds the maximum program/erase count the process comes to an end. Otherwise the process moves to block 1210.

Figure 13:
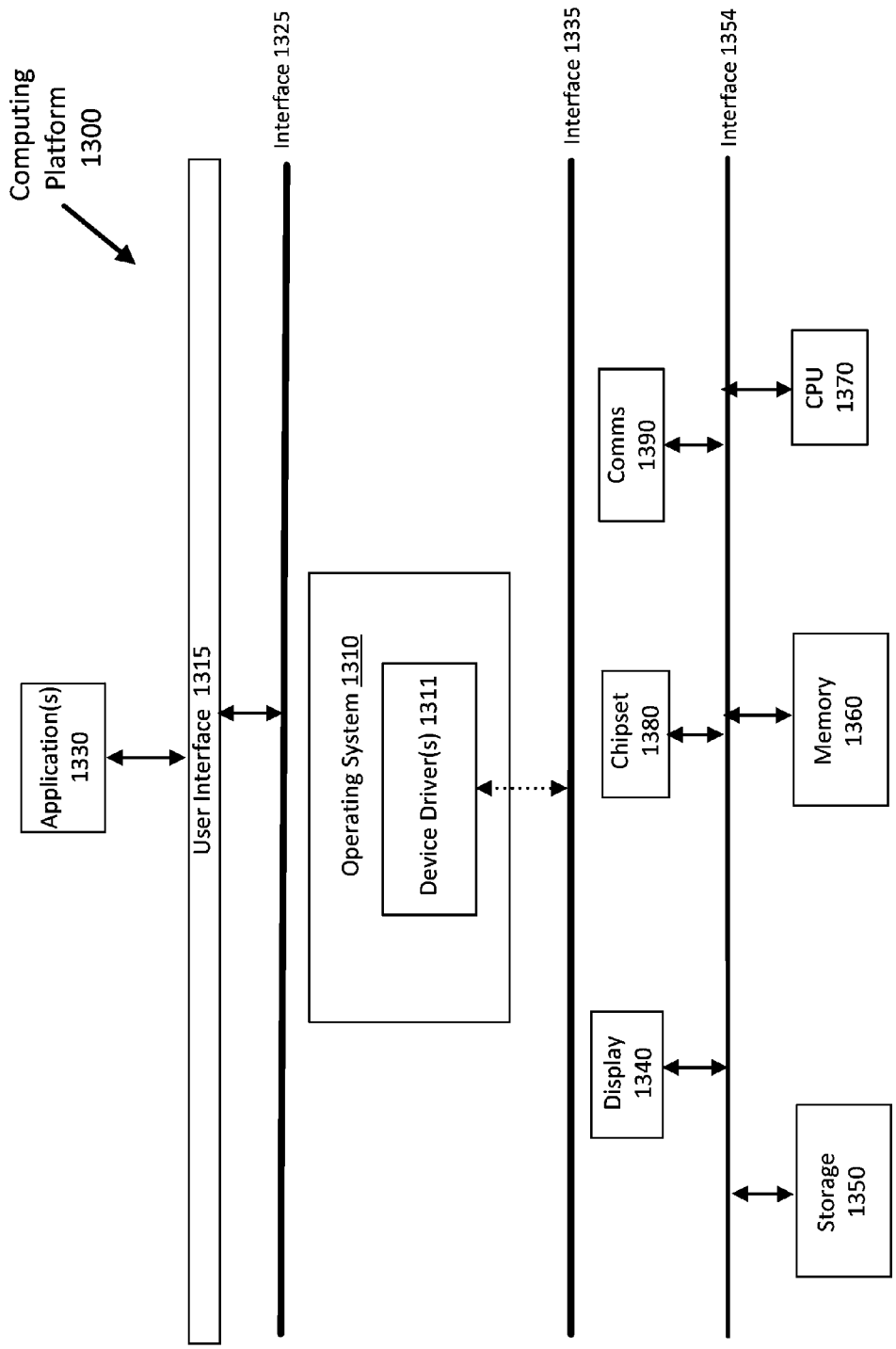
FIG. 13 illustrates an example computing platform.

FIG. 13 illustrates an example computing platform 1300. As shown in FIG. 13, computing platform 1300 includes an operating system 1310, application(s) 1330, an input/output (I/O) device(s) 1340, a storage 1350, a memory 1360, a central processing unit (CPU) 1370, a chipset 1380, and communications (Comms) 1390. According to some examples, several interfaces are also depicted in FIG. 13 for interconnecting and/or communicatively coupling elements of computing platform 1300. For example, user interface 1315 and interface 1325 may allow for users (not shown) and/or application(s) 1330 to couple to operating system 1310. Also, interface 1335 may allow for elements of operating system 1310 (e.g., device driver(s) 1312) to communicatively couple to elements of computing platform 1300 such as I/O device(s) 1340, storage 1350, memory 1360, CPU 1370, chipset 1380 or comms 1390. Interface 1354, for example, may allow hardware and/or firmware elements of computing platform 1300 to communicatively couple together, e.g., via a system bus or other type of internal communication channel.

In some examples, application(s) 1330 may include applications that may be implemented on computing platform 1300. For these examples, applications(s) 1330 may request access or use of elements of computing platform 1300 such as storage 1350 or memory 1360.

According to some examples, as shown in FIG. 13, operating system 1310 may include device driver(s) 1312. Device driver(s) 1312 may include logic and/or features configured to interact with hardware/firmware type elements of computing platform 1300 (e.g., via interface 1335). For example, device driver(s) 1312 may include device drivers to control or direct storage 1350 or memory 1360 to fulfill requests made by application(s) 130 or operating system 1310.

Although not shown, computing platform 1300 may include various interface circuits, such as an Ethernet interface and/or a Universal Serial Bus (USB) interface, and/or the like. In some examples, I/O device(s) 1340 may include one or more input devices connected to interface circuits for entering data and commands to be implemented by elements of computing platform 1300. For example, the input devices may include a keyboard, mouse, touch screen, track pad, track ball, isopoint, a voice recognition system, and/or the like. Similarly, the I/O device(s) 1340 may include one or more output devices connected to the interface circuits for outputting information to an operator. For example, the output devices may include one or more displays, printers, speakers, and/or other output devices, if desired. For example, one of the output devices may be a display. The display may be a cathode ray tube (CRTs), liquid crystal displays (LCDs), or any other type of display.

In some examples, storage 1350 may include various types of memory configured to be implemented or operated in a storage mode of operation. Storage 1350 may include at least one or a combination of different types of storage devices to store relatively large amounts of data. These different types of storage devices may include, but are not limited to, one or more of a magnetic disk drive, an optical disk drive, a tape drive, an internal storage device, an attached storage device, flash memory, battery backed-up SDRAM (synchronous DRAM), a network accessible storage device, and/or other types of non-volatile memory (e.g., phase change material (PCM)).

As shown in FIG. 13, storage 1350 also includes a controller 1352 to facilitate control or access to the memory maintained at storage 1350. In some examples, controller 1352 may include an endurance manager similar to endurance manager 112 described above. For these examples, at least some of the types of memory included at storage 1350 may include non-volatile memory such as NAND memory. The endurance manager included in controller 1352 may implement one or more endurance extending schemes for the non-volatile memory as described above. In other examples, chipset 1380 may include a controller to facilitate control or access to storage 1350 and an endurance manager may be included in that controller.

According to some examples, memory 1360 may include types of memory configured to be implemented or operated in a memory mode of operation. In a memory mode of operation, memory 1360 may be utilized by various elements of computing platform 1300 (e.g., as off-chip memory). For these implementations, memory 1360 may include at least one or a combination of different types of memory to include random access memory (RAM), dynamic random access memory (DRAM), static RAM (SRAM), phase change material RAM (PRAM), or types of non-volatile memory to include NOR memory.

According to some examples, CPU 1370 may be implemented as a central processing unit for computing platform 1300. CPU 1370 may include one or more processing units or elements having one or more processor cores or having any number of processors having any number of processor cores. CPU 1370 may include any type of processing unit, such as, for example, a multi-processing unit, a reduced instruction set computer (RISC), a processor having a pipeline, a complex instruction set computer (CISC), digital signal processor (DSP), and so forth.

In some examples, chipset 1380 may provide intercommunication among operating system 1310, I/O device(s) 1340, storage 1350, memory 1360, CPU 1370 or comms 1390. For example, chipset 1380 may provide intercommunication between operating system 1310, I/O device(s) 1340, storage 1350 and CPU 1370 to retrieve information from storage 1350 to display graphics on a display included with I/O device(s) 1340 that were rendered by CPU 1370 at the request of operating system 1310.

In some examples, comms 1390 may include logic and/or features to enable computing platform 1300 to communicate externally with elements remote to computing platform 1300. These logic and/or features may include communicating over wired and/or wireless communication channels or connections via one or more wired or wireless networks. In communicating across such networks, comms 1390 may operate in accordance with one or more applicable communication or networking standards in any version.

As mentioned above, interface 1354, may allow hardware and/or firmware elements of computing platform 1300 to communicatively couple together. According to some examples, communication channels interface 1354 may operate in accordance with one or more protocols or standards. These protocols or standards may be described in one or one or more industry standards (including progenies and variants) such as those associated with the Open NAND Flash Interface Specification (ONFi), the Inter-Integrated Circuit (I²C) specification, the System Management Bus (SMBus) specification, the Accelerated Graphics Port (AGP) specification, the Peripheral Component Interconnect Express (PCI Express) specification, the Universal Serial Bus (USB), specification or the Serial Advanced Technology Attachment (SATA) specification. Although this disclosure is not limited to only the above-mentioned standards and associated protocols.

In some examples, computing platform 1300 may be included in a computing device. Examples of a computing device may include a server, a desktop computer, a personal computer (PC), laptop computer, an ultra-mobile computer, a tablet, a touch pad, a portable computer, a handheld computer, a palmtop computer, a personal digital assistant (PDA), a cellular telephone, combination cellular telephone/PDA, a television, a smart device (e.g., smart phone, smart tablet or smart television), a mobile internet device (MID), a messaging device, a data communication device, and so forth.

Various examples may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one example may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture. An article of manufacture may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof.

According to some examples, an article of manufacture may include a non-transitory storage medium to store or maintain instructions that when executed by a computer or system, cause the computer or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a computer to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
   determining a current program/erase cycle count for one or more memory cells of a non-volatile memory array;
   comparing the current program/erase cycle to a first target program/erase cycle count; and
   implementing one or more cycling endurance extending schemes based on whether the current program/erase cycle count exceeds the first target program/erase cycle count or based on whether a failure trigger associated with the one or more memory cells has been reached, the one or more cycling endurance extending schemes to include at least one of a gradual read window expansion that includes incrementally extending a read window for reading the one or more memory cells by adjusting an erase threshold voltage to cause the read window to have a larger threshold voltage range to read all programmed values from the one or more memory cells, a gradual read window shift that includes incrementally shifting the read window for reading one or more memory cells by raising the erase threshold voltage and lowering a program threshold to cause the read window to shift while maintaining a threshold voltage range to read all programmed values from the one or more memory cells, an erase blank check algorithm, a dynamic soft-program or a dynamic pre-program.

2. The method of claim 1, comprising the failure trigger to include a maximum bit error rate for the one or more memory cells and implementing the gradual read window expansion cycling endurance extending scheme based on the one or more memory cells having a measured bit error rate that exceeds the maximum bit error rate.

3. The method of claim 1, comprising the failure trigger to include a block fail trigger point for the one or more memory cells and implementing the gradual read window expansion cycling endurance extending scheme based on a memory block associated with the one or more memory cells reaching the block fail trigger point.

4. The method of claim 1, comprising the failure trigger to include a first block erase verify failure for a memory block associated with the one or more memory cells and implementing the erase blank check algorithm based on the first block erase verify failure, implementing the erase blank check algorithm to include:
   applying a second gate voltage to the one or more memory cells, the second gate voltage higher than a first gate voltage applied to the one or more memory cells that triggered the first block erase verify failure;
   determining whether a second block erase verify failure has occurred following application of the second gate voltage; and
   identifying the block associated with the one or more memory cells as passing or failing block erase verify based on the determination of whether the second block erase verify failure has occurred.

5. The method of claim 1, the gradual read window expansion that includes incrementally extending the read window comprises the read window extending increment to be associated with the first target program/erase cycle count being exceeded.

6. The method of claim 1, comprising the gradual read window expansion that includes incrementally extending the read window comprises incrementally extending to include loading a first erase trim set that adjusts the erase threshold voltage based on the first target program/erase cycle count.

7. The method of claim 6, comprising the first erase trim set to include a start erase gate voltage for the one or more memory cells, a step size and a pulse width for an erase cycle.

8. The method of claim 1, the gradual read window expansion that includes incrementally extending the read window comprises adjusting both the erase threshold voltage and a program threshold voltage to cause the read window to have the larger threshold voltage range to read all programmed values from the one or more memory cells, the read window extending increment to be associated with the first target program/erase cycle count being exceeded.

9. The method of claim 8, comprising adjusting both the erase threshold voltage and adjusting the program threshold voltage to cause the read window to have a larger threshold voltage range includes loading a first trim profile that includes an erase trim set, the adjusted program threshold voltage and a program trim set, the first trim profile to be associated with the first target program/erase cycle count.

10. The method of claim 1, the gradual read window shift that includes incrementally shifting the read window comprises the read window shifting increment to be associated with the first program/erase cycle count being exceeded.

11. The method of claim 1, comprising implementing the dynamic soft-program by stopping soft-program of the one or more memory cells based on the current program/erase cycle count exceeding the first target program/erase cycle count.

12. The method of claim 1, comprising implementing the dynamic pre-program by selectively performing pre-program on the one or more memory cells based on the current program/erase cycle count exceeding the first target program/erase cycle count, selectively performing pre-program to include performing pre-program only where the one or more memory cells were partially programmed and erased.

13. The method of claim 1, comprising the one or more memory cells of the non-volatile memory array configured as NAND flash memory.

14. An apparatus comprising:
a processor circuit; and
a memory unit communicatively coupled to the processor circuit, the memory unit arranged to store an endurance manager operative on the processor circuit to determine a current program/erase cycle count for one or more memory cells of a non-volatile memory array and compare the current program/erase cycle to a first target program/erase cycle count, the endurance manager also configured to implement one or more cycling endurance extending schemes based on whether the current program/erase cycle count exceeds the first target program/erase cycle count or based on whether a failure trigger associated with the one or more memory cells has been reached, the one or more cycling endurance extending schemes to include at least one of gradual read window expansion that includes incrementally extending a read window for reading the one or more memory cells by adjusting an erase threshold voltage to cause the read window to have a larger threshold voltage range to read all programmed values from the one or more memory cells, a gradual read window shift that includes incrementally shifting the read window for reading one or more memory cells by raising the erase threshold voltage and lowering a program threshold to cause the read window to shift while maintaining a threshold voltage range to read all programmed values from the one or more memory cells, an erase blank check algorithm, a dynamic soft-program or a dynamic pre-program.

15. The apparatus of claim 14, comprising the one or more memory cells of the non-volatile memory array configured as NAND flash memory.

16. The apparatus of claim 14, comprising the failure trigger to include a maximum bit error rate for the one or more memory cells and the endurance manager configured to implement the gradual read window expansion cycling endurance extending scheme based on the one or more memory cells having a measured raw bit error rate that exceeds the maximum bit error rate.

17. The apparatus of claim 14, comprising the failure trigger to include a first block erase verify failure for a memory block associated with the one or more memory cells and the endurance manager configured to implement the erase blank check algorithm based on the first block erase verify failure, implementing the erase blank check algorithm to include the endurance manager configured to:
cause a second gate voltage to be applied to the one or more memory cells, the second gate voltage higher than a first gate voltage applied to the one or more memory cells that triggered the first block erase verify failure;
determine whether a second block erase verify failure has occurred following application of the second gate voltage; and
identify the block associated with the one or more memory cells as passing or failing block erase verify based on the determination of whether the second block erase verify failure has occurred.

18. The apparatus of claim 14, the endurance manager configured to implement the gradual read window expansion by incrementally extending the read window comprises the read window extending increment to be responsive to the first target program/erase cycle count being exceeded.

19. The apparatus of claim 14, the endurance manager configured to implement the gradual read window expansion by incrementally extending the read window comprises the endurance manager configured to adjust both the erase threshold voltage and a program threshold voltage to cause the read window to have the larger threshold voltage range associated with reading all programmed values from the one or more memory cells, the read window extending increment to be responsive to the first target program/erase cycle count being exceeded.

20. The apparatus of claim 14, the endurance manager configured to implement the gradual read window shift by incrementally shifting the read window comprises the read window shifting increment to be responsive to the first program/erase cycle count being exceeded.

21. The apparatus of claim 14, comprising the endurance manager configured to implement the dynamic soft-program by stopping soft-program of the one or more memory cells responsive to the current program/erase cycle count exceeding the first target program/erase cycle count.

22. The apparatus of claim 14, comprising the endurance manager configured to implement the dynamic pre-program by causing selective usage of pre-program on the one or more memory cells responsive to the current program/erase cycle count exceeding the first target program/erase cycle count, selective usage of pre-program to include performing pre-program only where the one or more memory cells were partially programmed and erased.

23. An article of manufacture comprising a storage medium containing instructions that when executed cause a system to:
- determine a current program/erase cycle count for one or more memory cells of a non-volatile memory array;
- compare the current program/erase cycle to a first target program/erase cycle count; and
- implement a cycling endurance extending scheme based on whether the current program/erase cycle count exceeds the first target program/erase cycle count or based on whether a failure trigger associated with the one or more memory cells has been reached, the cycling endurance extending scheme to include a gradual read window expansion that includes incrementally extending a read window for reading the one or more memory cells by adjusting an erase threshold voltage to cause the read window to have a larger threshold voltage range to read all programmed values from the one or more memory cells.

24. The article of manufacture of claim 23, comprising the failure trigger to include a maximum bit error rate for the one or more memory cells and the instructions to cause the system to implement the gradual read window expansion based on the one or more memory cells having a measured bit error rate that exceeds the maximum raw bit error rate.

25. The article of manufacture of claim 23, the instructions to cause the system to implement the gradual read window expansion by causing the system to incrementally extend the read window comprises the incremental read window extension to be responsive to the first target program/erase cycle count being exceeded.

26. The article of manufacture of claim 23, comprising the instructions to cause the system to implement the gradual read window expansion by causing the system to incremental extend a read window comprises the incremental extension to include an adjustment to both the erase threshold voltage and a program threshold voltage to cause the read window to have the larger threshold voltage range to read all programmed values from the one or more memory cells, the incremental read window extension to be responsive to the first target program/erase cycle count being exceeded.

27. The article of manufacture of claim 26, comprising the adjustment to both the erase threshold voltage and the program threshold voltage to cause the read window to have a larger threshold voltage range includes the system to load a first trim profile that includes an erase trim set, the adjusted program threshold voltage and a program trim set, the first trim profile to be associated with the first target program/erase cycle count.

* * * * *